(12) United States Patent
Miller et al.

(10) Patent No.: US 6,627,050 B2
(45) Date of Patent: Sep. 30, 2003

(54) METHOD AND APPARATUS FOR DEPOSITING A TANTALUM-CONTAINING LAYER ON A SUBSTRATE

(75) Inventors: Michael Andrew Miller, Sunnyvale, CA (US); Peijun Ding, San Jose, CA (US); Howard Tang, San Jose, CA (US); Tony Chiang, Santa Clara, CA (US); Jianming Fu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/916,412

(22) Filed: Jul. 26, 2001

(65) Prior Publication Data

US 2002/0029093 A1 Mar. 7, 2002

Related U.S. Application Data

(60) Provisional application No. 60/221,597, filed on Jul. 28, 2000.

(51) Int. Cl.$^7$ .......................... C23C 14/34; B05D 1/36; G06F 12/00
(52) U.S. Cl. ................. 204/192.22; 204/192.15; 204/298.11; 204/298.16; 204/298.17; 204/298.2; 204/298.22; 427/402; 427/404; 711/1
(58) Field of Search ............... 204/192.15, 192.22, 204/298.11, 298.16, 298.17, 298.2, 298.22, 298.13; 711/1; 427/404, 402

(56) References Cited

U.S. PATENT DOCUMENTS

| | | | |
|---|---|---|---|
| 5,231,306 A | 7/1993 | Meikle et al. | 257/751 |
| 5,378,660 A | 1/1995 | Ngan et al. | 437/247 |
| 5,679,980 A | 10/1997 | Summerfelt | 257/751 |
| 5,760,474 A | 6/1998 | Schuele | 257/754 |
| 5,770,025 A | 6/1998 | Kiyota | 204/298.2 |
| 5,856,236 A | 1/1999 | Lai et al. | 438/681 |
| 5,877,087 A | 3/1999 | Mosely et al. | 438/656 |
| 5,948,215 A * | 9/1999 | Lantsman | 204/192.12 |
| 5,989,999 A | 11/1999 | Levine et al. | 438/627 |
| 5,998,225 A | 12/1999 | Crenshaw et al. | 438/3 |
| 6,002,174 A | 12/1999 | Akram et al. | 257/751 |
| 6,080,287 A | 6/2000 | Drewery et al. | 204/192.15 |
| 6,139,699 A | 10/2000 | Chiang et al. | 204/192.15 |
| 6,183,614 B1 * | 2/2001 | Fu | 204/298.2 |
| 6,210,539 B1 | 4/2001 | Tanaka et al. | 204/192.12 |
| 6,228,235 B1 | 5/2001 | Tepman et al. | 204/298.2 |
| 6,296,747 B1 * | 10/2001 | Tanaka | 204/298.07 |
| 6,423,192 B1 * | 7/2002 | Wada et al. | 204/192.12 |

FOREIGN PATENT DOCUMENTS

| | | | |
|---|---|---|---|
| EP | 1 091 016 A2 | 4/2001 | C23C/14/35 |
| JP | 58-56361 | 4/1983 | H01L/27/01 |
| WO | WO 98/54377 | 12/1998 | C23C/14/14 |
| WO | WO 00/48226 | 8/2000 | H01J/37/34 |

OTHER PUBLICATIONS

PCT Search Report dated Oct. 10, 2002 for PCT/US01/23702.

* cited by examiner

Primary Examiner—Steven H. VerSteeg
(74) Attorney, Agent, or Firm—Charles S. Guenzer

(57) ABSTRACT

A method of forming a tantalum-containing layer on a substrate is described. The tantalum-containing layer is formed using a physical vapor deposition technique wherein a magnetic field in conjunction with an electric field function to confine material sputtered from a tantalum-containing target within a reaction zone of a deposition chamber. The electric field is generated by applying a power of at least 8 kilowatts to the tantalum-containing target. The magnetic field is generated from a magnetron including a first magnetic pole of a first magnetic polarity surrounded by a second magnetic pole of a second magnetic polarity opposite the first magnetic polarity. The first magnetic pole preferably has a magnetic flux at least about 30% greater than a magnetic flux of the second magnetic pole. The tantalum-containing layer deposition method is compatible with integrated circuit fabrication processes. In one integrated circuit fabrication process, an interconnect structure is formed.

54 Claims, 7 Drawing Sheets

METHOD AND APPARATUS FOR DEPOSITING A TANTALUM-CONTAINING LAYER ON A SUBSTRATE

This application claims the benefit of U.S. Provisional Application No. 60/221,597 filed on Jul. 28, 2000, which is herein incorporated by reference.

BACKGROUND OF THE INVENTION

1. Field of the Invention

The invention relates to a method and apparatus for depositing a tantalum-containing layer on a substrate. More particularly, the invention relates to a method and apparatus for sputter depositing tantalum and/or tantalum nitride layers using a self-ionized plasma (SIP).

2. Description of the Background Art

Integrated circuits (ICs) typically include metal conductive layers that are used to interconnect various individual devices of the IC. As the density of integrated circuits increases, more and more levels of metallization are employed to provide electrical connection between these devices.

The metal conductive layers are typically isolated from each other by one or more dielectric material layers. Holes (vias) formed through the dielectric layers provide electrical access between successive conductive interconnection layers.

For the current subhalf-micron (0.5 $\mu$m) generation of semiconductor devices, any microscopic reaction at an interface between interconnection layers can cause degradation of the resulting integrated circuits (e.g., increase the resistivity of the interconnection layers). Barrier layers prevent degradation of interfaces between conductive and dielectric layers and have consequently become a critical component for improving the reliability of interconnect metallization schemes.

Refractory metals and their compounds, such as, for example, tantalum (Ta) and tantalum nitride (TaN) have been suggested as diffusion barriers for copper and other metallizations. Tantalum and tantalum-containing materials have low resistivity (resistivity less than about 15 $\Omega$-cm), and show excellent performance in preventing the diffusion of copper into underlying layers as well in preventing the diffusion of fluorine and/or oxygen from low-k dielectric materials into the copper. In particular, tantalum-based barrier layers comprising two separate layers, a layer of tantalum deposited on a tantalum nitride layer, have been found particularly advantageous. The combination of these two layers provides excellent adhesion for copper as well as good barrier properties.

Physical vapor deposition (PVD) processes typically use a DC magnetron sputtering reactor. Such a sputter reactor includes a target composed of the layer to be sputter deposited along with a magnetron powered by a DC electrical source. The magnetron is scanned across the target thereby sputtering target material onto a substrate disposed inside the reactor.

However, conventional DC magnetron sputtering processes sputter atoms across a wide angular distribution that typically has a cosine dependence about the target. Such a wide distribution is disadvantageous for filling a high aspect ratio structure. This is because the off-angle sputtered particles preferentially deposits the barrier material around the upper corners of the high aspect ratio structure forming overhangs. Large overhangs on the high aspect ratio structures restrict the deposition of barrier material therein and at a minimum cause inadequate coverage along the sidewalls and bottom surfaces thereof.

One approach to ameliorate the overhang problem uses long-throw sputtering in a conventional reactor. In long-throw sputtering, the target is spaced relatively far from the substrate to be sputter coated. For example, the target-to-wafer spacing in long throw sputtering is typically greater than at least 50% of the wafer diameter. As such, the off-angle portion of the sputtering distribution is preferentially directed toward the chamber walls, while the central-angle portion remains directed toward the wafer. This truncated angular distribution for the sputtered material causes a higher fraction of the sputter particles to be directed into the high aspect ratio structure, thereby reducing the extent of overhangs thereon. However, the step-coverage of barrier layers formed using this sputter deposition technique may be discontinuous, particularly for high aspect ratio features.

Another PVD technique for depositing barrier layers in high aspect ratio features uses a high-density plasma (HDP) sputtering process. A high-density plasma sputtering process refers to a sputtering process having an average plasma density across the plasma of at least $10^{11}$ cm$^{-3}$. In HDP sputtering processes, a separate plasma source region is formed away from the substrate, for example, by inductively coupling RF power into an electrical coil wrapped around a plasma source region between the target and the substrate. The higher power ionizes not only the argon working gas, but also significantly increases the ionization fraction of the sputtered atoms. The substrate either self-charges to a negative potential or is RF biased to control its DC potential. The sputtered atoms are accelerated across the plasma sheath as they approach the negatively biased substrate. As a result, their angular distribution becomes strongly peaked in the forward direction so that they are drawn deeply into the high aspect ratio feature. Overhangs become much less of a problem in HDP sputtering, and bottom surface coverage as well as bottom sidewall coverage are relatively uniform in the center of the substrate.

However, HDP-deposited barrier layers typically have poor step coverage high up the sidewalls of high aspect ratio features. This is particularly true for high aspect structures located at the edges of the substrate. Furthermore, the sidewall coverage is typically asymmetric, with the side facing the center of the target being more heavily coated than the more shielded side facing a larger solid angle outside the target. This poor step coverage often results in voids and defects in the barrier layer, which then result in device failure.

Additionally, for some HDP sputtering processes a pressure of at least 30 milliTorr may be required. Such higher pressures for the high-density plasma produces a large number of inert gas ions, which may be accelerated across the plasma sheath toward the surface being sputter deposited. The high-energy inert gas ions may cause a number of problems such as the inadvertent embedding of inert gas ions in the deposited layer causing the surface morphology thereof to be rough, or even discontinuous, which then may result in device failure.

Therefore, a need exists for a method and apparatus for depositing a tantalum-containing barrier layer in high aspect ratio features.

SUMMARY OF THE INVENTION

A method of forming a tantalum-containing layer on a substrate is described. The tantalum-containing layer is formed using a physical vapor deposition technique wherein a magnetic field in conjunction with an electric field function to confine material sputtered from a tantalum-containing target within a reaction zone of a deposition chamber. The electric field is generated by applying a power of at least 8 kilowatts to the tantalum-containing target. The magnetic field is generated from a magnetron including a first magnetic pole of a first magnetic polarity surrounded by a second magnetic pole of a second magnetic polarity opposite the first magnetic polarity. The first magnetic pole preferably has a magnetic flux at least about 30% greater than a magnetic flux of the second magnetic pole. The deposition chamber may optionally comprise one or more shields positioned along sidewalls of the deposition chamber and adjacent to both the tantalum-containing target and the substrate. At least one of the one or more shields includes perforations through which reactive gases are provided to the deposition chamber.

The tantalum-containing layer deposition method is compatible with integrated circuit fabrication processes. In one integrated circuit fabrication process, an interconnect structure is formed. For such an embodiment, a preferred process sequence includes providing a substrate having a dielectric material thereon, wherein the dielectric material has one or more vias therein. One or more tantalum-containing barrier layers are deposited in the vias using a physical vapor deposition technique wherein a magnetic field in conjunction with an electric field function to confine material sputtered from a tantalum-containing target within a reaction zone of a deposition chamber. After the one or more tantalum-containing barrier layers are deposited in the vias, the interconnect structure is completed by filling the vias with a conductive material.

BRIEF DESCRIPTION OF THE DRAWINGS

The teachings of the present invention can be readily understood by considering the following detailed description in conjunction with the accompanying drawing, in which.

DETAILED DESCRIPTION OF THE INVENTION

Figure 1:
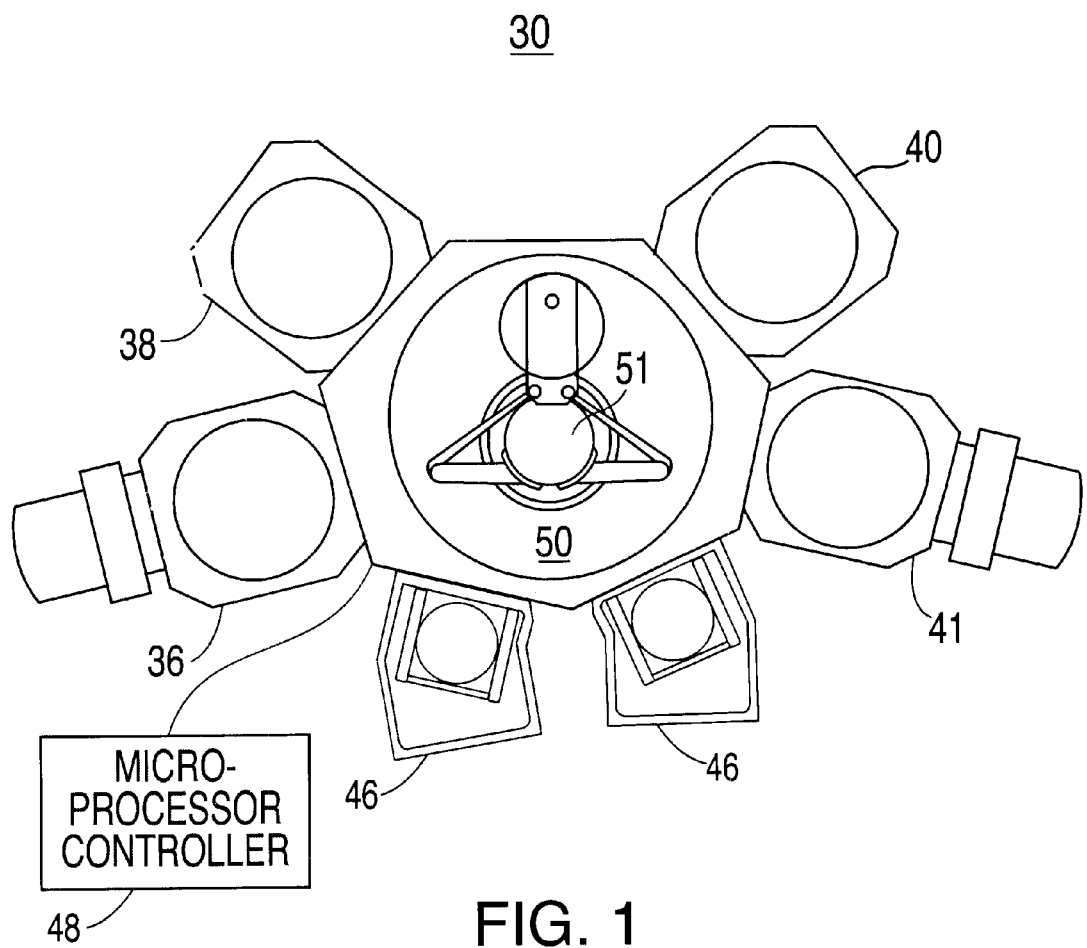
FIG. 1 depicts a schematic representation of an integrated processing system that may be used for the practice of embodiments described herein.

FIG. 1 depicts a schematic representation of an integrated processing system 30 (e.g., a cluster tool), suitable for practicing embodiments of the present invention. Examples of integrated processing systems include PRECISION 5000®️ systems, ENDURA®️ systems and CENTURA®️ systems, commercially available from Applied Materials Inc., of Santa Clara, Calif.

The integrated processing system 30 typically comprises process chambers 36, 38, 40, 41, load-lock chambers 46, a transfer chamber 50, a microprocessor controller 48, along with other hardware components such as power supplies (not shown) and vacuum pumps (not shown). Details of the integrated processing system are described in commonly assigned U.S. Pat. No. 5,186,718, entitled, "Staged-Vacuum Substrate Processing System and Method", issued on Feb. 16, 1993, and is hereby incorporated by reference. The salient features of this system 30 are briefly described below.

The integrated processing system 30 includes a transfer chamber 50, containing a transfer robot 51. The transfer chamber 50 is coupled to load-lock chambers 46 as well as a cluster of process chambers 36, 38, 40, 41.

Substrates (not shown) are loaded into the wafer processing system 30 through load-lock chambers 46. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, self-ionized plasma physical vapor deposition (SIP PVD) chambers, chemical vapor deposition (CVD) chambers, rapid thermal process (RTP) chambers, and anti-reflective coating (ARC) chambers, among others.

Figure 2:
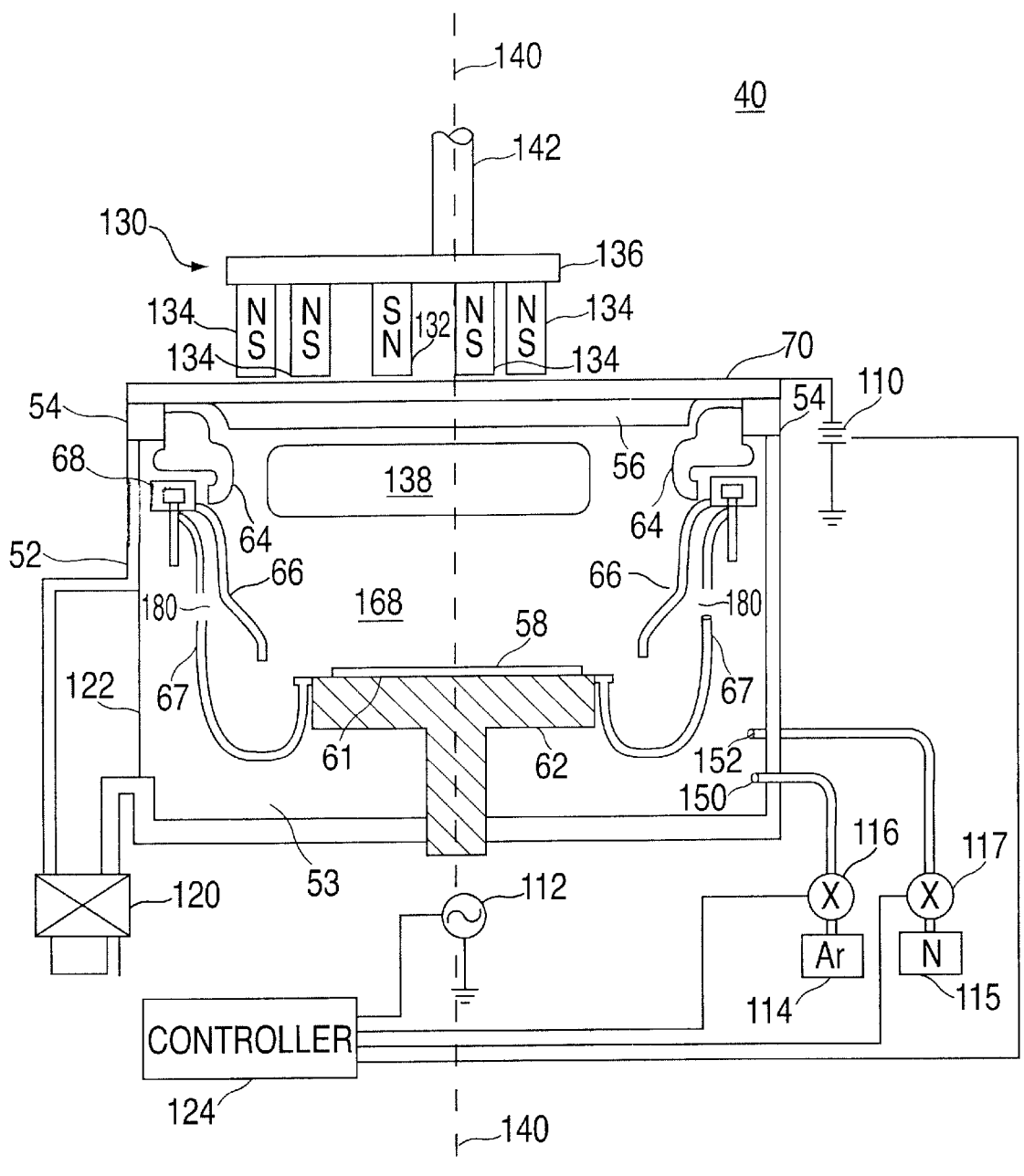
FIG. 2 depicts a schematic diagram of a sputtering reactor that may be used for the practice of embodiments described herein.

FIG. 2 is a schematic representation of a PVD sputter reactor 40 that can be used to perform integrated circuit fabrication in accordance with embodiments described herein. Reactor 40 includes a vacuum chamber 52, formed of metal such as stainless steel, and electrically grounded, through a target isolator 54 from a target 56.

The target 56 is coupled to a backing plate 70 which preferably supports the target 56. The backing plate 70 is typically soldered or diffusion bonded to the target 56. The backing plate 70 may comprise, for example, an alloy of copper and chromium.

The target 56 has at least a surface portion composed of the material to be deposited. The target 56 for example, may comprise a tantalum-containing material, which may be essentially pure tantalum or a tantalum alloy, to be sputter deposited on a wafer 58. The alloy element comprising the tantalum alloy is typically present to less than 5 wt %.

A substrate 58 is supported on a pedestal 62. The pedestal 62 may comprise, for example, an electrostatic chuck (not shown) with a support surface 61, that is used to hold the substrate 58 in place within the chamber 52. The electrostatic chuck is preferably equipped with a means for adjusting and controlling the temperature of the substrate 58 held thereon. The temperature controlling means, may be, for example, a temperature-control fluid, such as, for example, water to cool the substrate 58 or a resistive heating element to warm the substrate 58.

The target 56 and the pedestal 62 are separated by a distance, often referred to as a throw distance. The throw distance is preferably greater than about 70% of the diameter of the substrate 58. For most PVD chambers the throw distance is in a range of about 140 mm to about 400 mm.

An upper shield 64 fills the space between the target and the upper edge of an inner shield 66. The upper shield 64 and the inner shield 66 function to prevent plasma from leaking into any significant gaps between these parts and the sidewalls of the chamber 52. The upper shield 64 is preferably isolated from the chamber in order to maintain a floating potential. The upper shield 64 typically protrudes into the process space far enough that it effectively shadows the backing plate 70 from deposition.

The upper shield 64 is positioned preferably between the inner shield 66 and the backing plate 70. The upper shield 64 is illustrated schematically in FIG. 3a. The upper shield 64 may be physically coupled to a cooling member 54 that is cooled by means of for example, a coolant. The cooling member 54 enables dissipation of heat from upper shield 64.

Figure 3A:
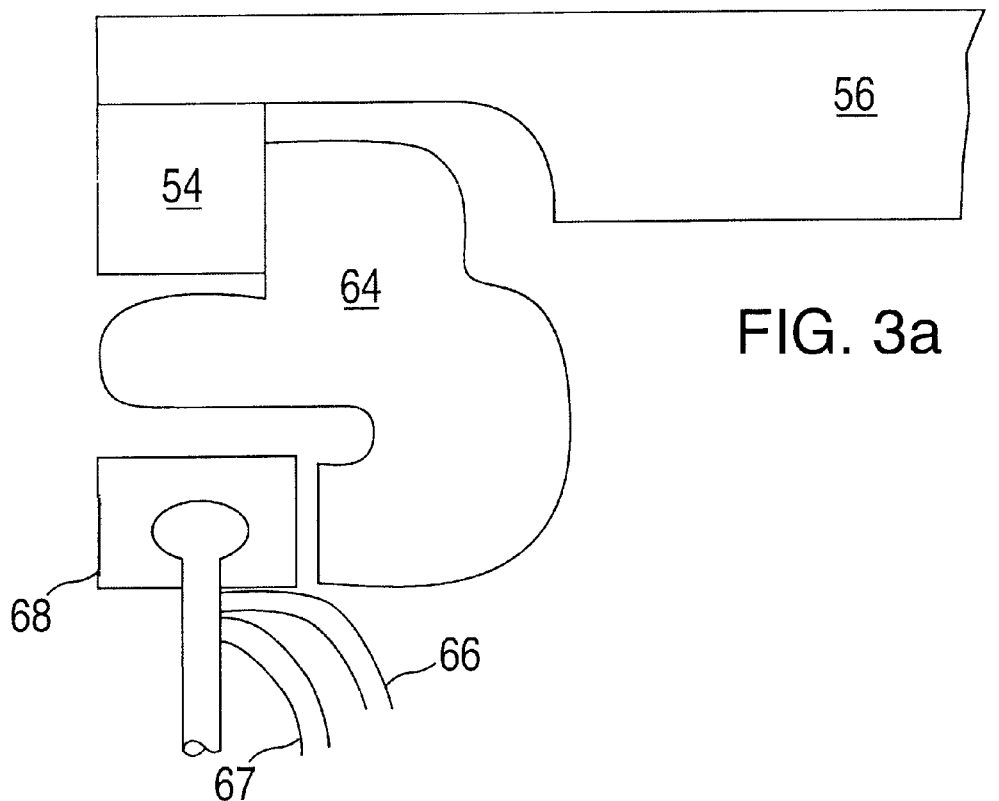
FIGS. 3a–3b depict magnified views of an upper shield of the sputtering reactor of FIG. 2.
Figure 3B:
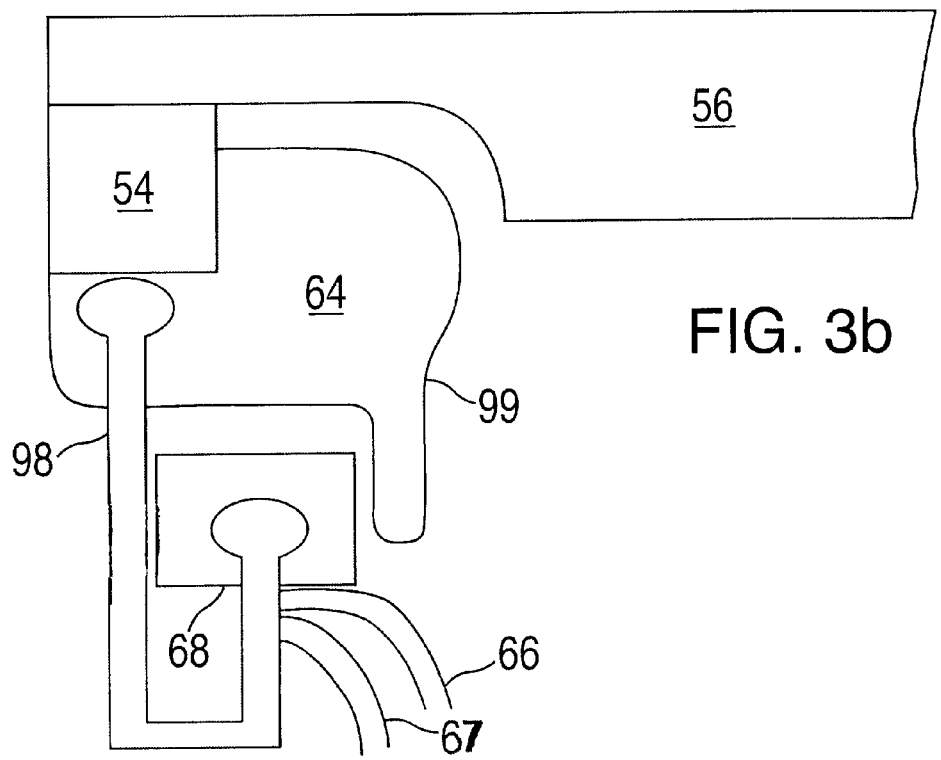

Geometric configurations of upper shield 64 other than the one depicted in FIG. 3a, are also compatible with embodiments described herein. For example, FIG. 3b illustrates an alternate configuration in which the upper shield 64 is cut away to open a space 99 at the corner of the target 56, such that the area of the plasma is expanded. This alternate configuration is advantageous for increasing plasma density when the upper shield 64 is grounded rather than maintained at a floating potential relative to the chamber. Upper shield 64 may be grounded to chamber 52 with a grounding clamp 98 (FIG. 3b). Although two geometric configurations of upper shield 64 have been revealed through illustration, it will be readily apparent to one skilled in the art that other modifications of the configuration of upper shield 64, used in either "grounded" or "floating" mode may be used and still lie within the scope of embodiments described herein.

Referring to FIG. 2, a lower shield 67 extending away from a support 68 along the wall 52 of the chamber to an elevation typically beneath the support surface 61 is also shown. Lower shield 67 comprises one or more perforations 180 therethrough that permit gases such as a sputtering gas (e.g. argon, neon, helium) as well as a reactive gas (e.g. nitrogen) to travel from gas inlet ports 150, 152 into an interior portion 168 of the chamber 52.

The one or more perforations 180 in lower shield 67 may be of any shape, including circular, elliptical, and rectangular, among others. Preferably, there are a plurality of perforations 180 in order to permit the gases to reach the interior portion 168 of the chamber 52. Lower shield 67 may have a variety of shapes, but it typically has one or more curved portions as shown in FIG. 2.

An inner shield 66 is generally disposed between a portion of the lower shield 67 and the target 56. In particular, the inner shield 66 is disposed between the perforations 180 in the lower shield 67 and the target 56 so that no line of sight pathway exists between the one or more perforations 180 and the target 56. The inner shield 66 is also positioned between the one or more perforations 180 and the substrate 58. By utilizing an inner shield 66 with such a geometric construction, it is possible to prevent the plasma from leaking through the one or more perforations 180 in the inner shield 66, thereby protecting the chamber 52 surfaces outside the interior portion 168 thereof from unwanted material deposition such as for example, tantalum-containing material.

The inner shield 66 may also have varying shapes and dimensions, but typically, the inner shield 66 comprises one or more curved portions as shown, for example, in FIG. 2. Inner shield 66 and lower shield 67 are typically symmetrical within the chamber 52 about a chamber axis 140.

The shields 64, 66 and 67 are typically formed of stainless steel and are electrically conductive. The sides of shields 64, 66 and 67 that are facing the interior 168 of the chamber 52 may be bead blasted or otherwise roughened to promote adhesion of the sputter deposited material thereon, so as to reduce flaking and peeling onto the substrate 58.

The configuration of the shields 64, 66, 67 in chamber 52 prevent the formation of undesirable tantalum compounds, such as tantalum nitride on the target 56, or so-called "poisoning" of the target. Target poisoning results in increased resistance of the target, a decrease in ionization current, and a reduced deposition rate.

A magnetron 130 is positioned above the target 56, as shown in FIG. 2. The magnetron 130 has opposed magnets 132, 134 connected and supported by a magnetic yoke 136. The magnets 132,134 create a magnetic field adjacent the target 56 within the chamber 52. The magnetic field forms a high-density plasma region 138 within the chamber 52. The magnetron 130 may be rotated about a chamber axis 140 by a motor-driven shaft 142 to achieve full coverage for the target 56. The magnetron, when rotated, typically covers about 10% to about 50% of the target area at any given time. Alternatively, the magnetron is rotated about an axis other than the chamber axis 140.

Figure 4A:
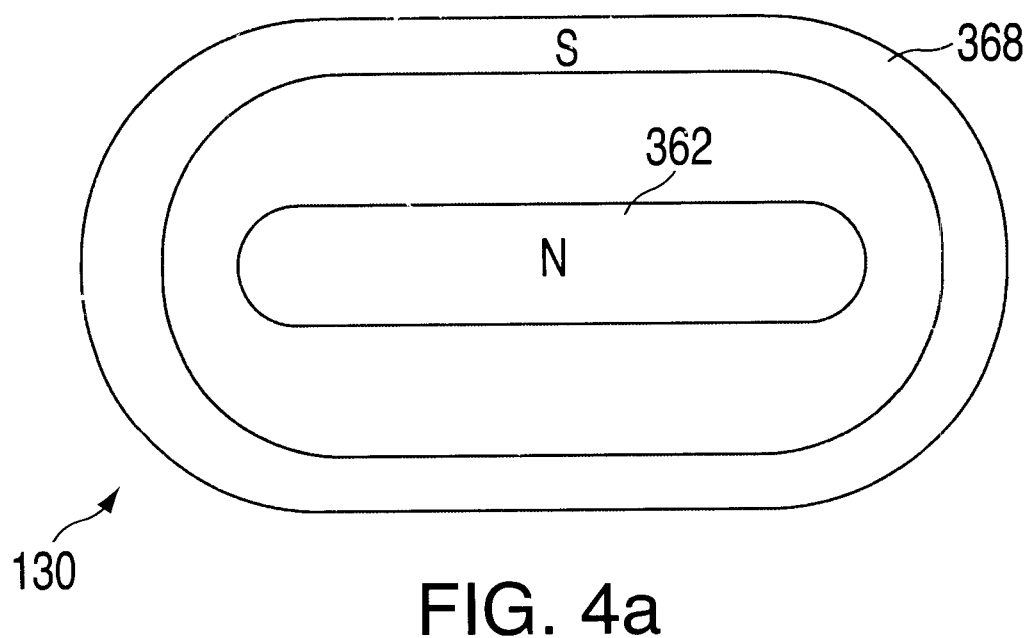
FIGS. 4a–4b depict a magnetron as well as component magnets that may be used in the sputtering reactor of FIG. 2.

To achieve a high-density plasma 138 of sufficient ionization density to allow sputtering of the target material, the power density delivered to the area adjacent the target 56 should have a relatively small area. Referring to FIG. 4a, the magnetron 130 may have, for example, a racetrack shape. Other magnetron shapes, however, are equally acceptable, including shapes such as an oval, a triangle, an eggshape, a circle, and a teardrop, among others.

Figure 4B:
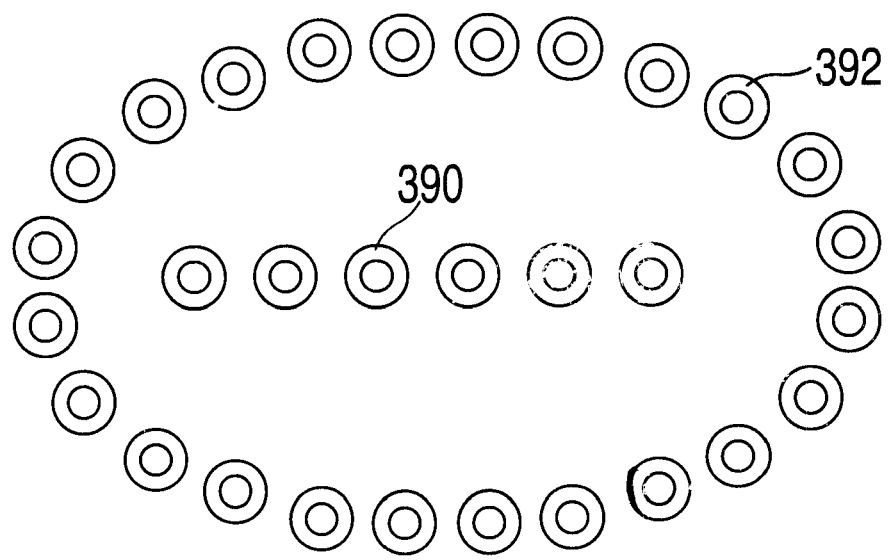

The magnetron 130 preferably has an inner pole 362 and an outer pole 368. The inner pole 362 and the outer pole 368 typically have different sizes and shapes. As shown in FIG. 4b, two sets of magnets 390, 392 are disposed in the poles 362, 368 to produce the two magnetic polarities. The magnets 390, 392 may be of different magnetic strength. Furthermore, to decrease the electron loss, the inner pole 362 represented by the inner magnets 390 should have no significant apertures and be surrounded by a continuous outer pole 368 represented by the outer magnets 392.

Figure 5:
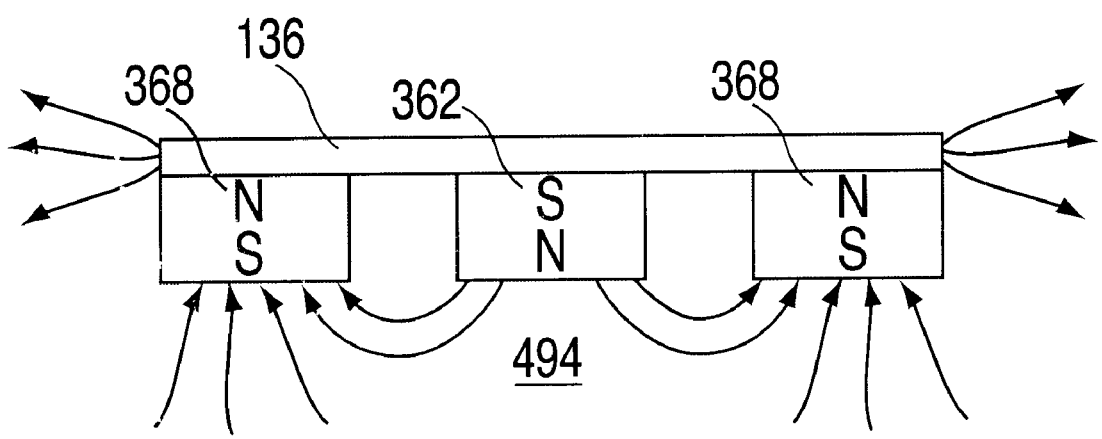
FIG. 5 depicts a side view of the magnetic field that may be produced using the magnetron described with respect to FIGS. 4a and 4b.

Referring to FIG. 5, the magnetic flux produced by the inner pole 362 should be smaller than the magnetic flux produced by the outer pole 368. The magnetic flux of the outer pole 368 is preferably at least about 1.3 times greater than the magnetic flux of the inner pole 362. As such, the magnetic field is very strong in a reactor processing area 494 adjacent to and between the poles 362, 368. Also, the magnetic field extends into the processing area 494, reducing electron loss to the grounded inner shield 66 and lower shield 67. This increases the ionization density of the plasma while simultaneously increasing the number of electrons arriving on the surface of the substrate 58. Furthermore, if electrons are lost from the magnetic field on one side of the inner pole, they are likely to be captured on the other side, thereby increasing the plasma density near the edges of the processing area 494 for a given power level.

Referring again to FIG. 2, a selectable DC power supply 110, is coupled to the target 56 and the inner shield 66 so that a DC bias may be applied to the inert sputtering gas in order to ignite and sustain a plasma. When power is applied to the target 56, a plasma comprising ions, electrons and neutral atoms is formed from the inert sputtering gas. The target 56 acts as a negatively biased cathode and shield 67 acts as a grounded anode.

The electric field accelerates the inert sputtering gas ions toward the target 56 for sputtering target particles from the target 56. The sputtered target particles may also become ionized in the plasma. Such a configuration enables deposition of sputtered and ionized target particles from the target 56 onto the substrate 58 forming a layer of sputter deposited material. The shields 66, 67 confine the sputtered particles and plasma gas within the interior 168 of the chamber 52 and prevent undesirable deposition of target material beneath the pedestal 62 or behind the target 56.

A controllable bias power supply 112, preferably an RF power supply, may also be coupled to the pedestal 62 for biasing the substrate 58, in order to control the deposition of the sputter deposited layer on the substrate 58. The bias power supply 112 is typically an AC source, having a frequency of, for example, about 13.56 kHz, or between about 400 kHz to about 500 MHz.

A first gas source 114 supplies a sputtering gas, typically a chemically inert noble gas such as, argon (Ar), to the chamber 53 through a mass flow controller 116 and gas inlet port 150. Other inert gases such as helium (He), neon (Ne), xenon (Xe), and combinations thereof, among others, may also be used as the sputtering gas. A second gas source 115 supplies a reactive gas, such as, for example, nitrogen, through a mass flow controller 117 and gas inlet port 152.

The location of the gas inlet ports 150, 152 may be, as illustrated in FIG. 2, near the bottom of the chamber 52. The ports 150, 152 are positioned such that the gases travel through the one or more perforations 180 in the lower shield 67 and around the inner shield 66 to the interior 168 of the chamber 52. A vacuum pump system 120 connected to the chamber 52 through port 122 maintains the chamber at a desired pressure. Although the base pressure can be held to about $10^{-7}$ Torr or even lower, the base pressure within the chamber 52 is typically maintained below about 10 milli-Torr.

A computer-based microprocessor controller 124 controls the reactor including the DC target power supply 110, the bias power supply 112 and the mass flow controllers 116, 117. The microprocessor controller 124 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routine, when executed, transforms the general purpose computer into a specific process computer that controls the chamber operation so that a chamber process is performed. Alternatively, the process of the present invention may be performed in hardware, as an application specific integrated circuit or other type of hardware implementation, or a combination of software or hardware.

Deposition of Tantalum-containing Layers

A tantalum-containing layer is formed using a self-ionized plasma physical vapor deposition (PVD) process wherein a magnetic field in conjunction with an electric field function to confine material sputtered from a tantalum-containing target within a reaction zone of a deposition chamber. The magnetic field is generated from a magnetron including a first magnetic pole of a first magnetic polarity surrounded by a second magnetic pole of a second magnetic polarity opposite the first magnetic polarity. The first magnetic pole preferably has a magnetic flux at least about 30% greater than a magnetic flux of the second magnetic pole.

In general, the following deposition process parameters can be used to conformably form the tantalum-containing layer using a PVD chamber such as the one depicted in FIG. 2. The process parameters range from a wafer temperature of about −40° C. to about 100° C., a chamber pressure of greater than about 1.0 mtorr, a sputtering gas flow rate of about 5 sccm to about 200 sccm, a DC target power of greater than about 8 kilowatts, a target bias of about −400 volts to about −600 volts, and a substrate bias power of up to about 1000 watts. The above PVD process parameters provide a deposition rate for the one or more barrier layers in a range of about 100 Å/min to about 600 Å/min.

Nitrogen ($N_2$) gas may be provided to the PVD deposition chamber when a tantalum nitride ($TaN_x$) based barrier layer is to be formed. When $TaN_x$ is formed nitrogen ($N_2$) gas with a flow rate in a range of about 5 sccm to about 200 sccm may be provided to the PVD chamber. The atomic percent of nitrogen in the as-deposited $TaN_x$ layer may be varied up to about 75 atomic % nitrogen.

The as-deposited tantalum-containing layers have good step coverage for high aspect ratio features without voids and/or discontinuities. In addition, such layers have a tensile stress of about $10^9$ dynes/cm$^2$, an order of magnitude lower than for PVD deposited layers deposited according to standard process conditions. Also, the resistance non-uniformity across the layer is less than about 5% for a 200 mm substrate.

Formation of Tantalum-containing Barrier Structures

1. Tantalum-containing Barrier Layer Structure

Figure 6A:
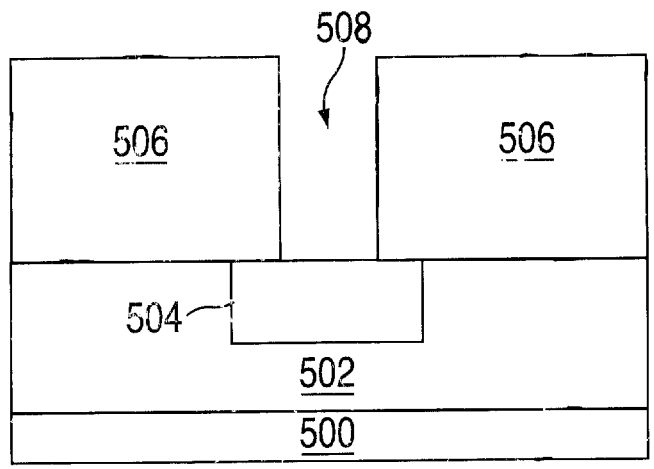
FIG. 6 depicts an interconnect structure that may be formed using embodiments described herein.
Figure 6B:
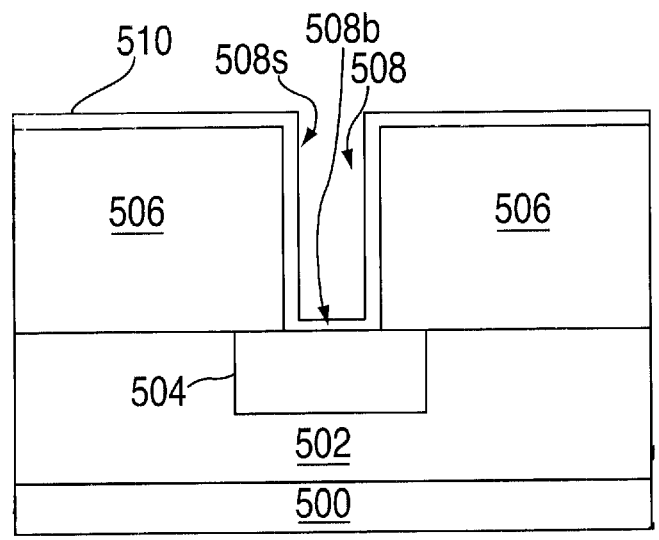
Figure 6C:
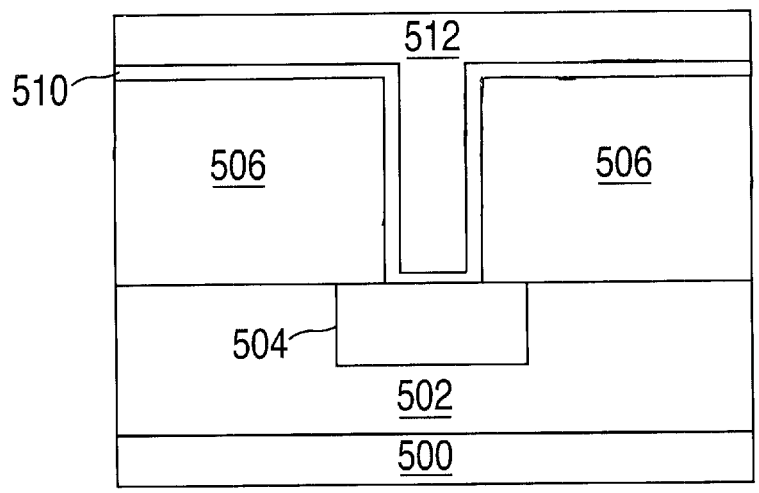

FIGS. 6a–6c illustrate schematic cross-sectional views of a substrate 500 at different stages of an integrated circuit fabrication sequence incorporating a tantalum-containing layer as a barrier layer. In general, the substrate 500 refers to any workpiece on which layer processing is performed. Depending on the specific stage of processing, the substrate 500 may correspond to a silicon wafer, or other material layers, which have been formed on the substrate. FIG. 6a, for example, illustrates a cross-sectional view of a substrate structure in which the substrate 500 is a silicon wafer having a material layer 502 thereon.

The material layer 502 may be, for example, a dielectric layer, such as, for example, silicon oxide or other insulating material. Material layer 502 has at least one feature 504 formed therein. The feature 504 may be, for example, a metal interconnect. The feature 504 may comprise, for example, copper. Alternatively, material layer 502 may be, for example, a silicon layer, and the feature 504 may be a doped silicon region.

A dielectric layer 506 having an opening or via 508 therethrough is formed over the feature 504. The dielectric layer is typically an insulation material, such as, for example, an oxide. While FIG. 6a depicts a rectangular via 508, the via may have any other cross-sectional shape. Additionally, the via 508 may not extend entirely through dielectric layer 506.

The via 508 preferably has a width of about 0.25 µm or less. Furthermore, the thickness of the dielectric layer 508 is preferably at least 1.0 µm. Thus, the aspect ratio of the via, defined as the height of the via divided by its width, is typically about 4:1 or greater.

The material layer 502 and dielectric layer 506 may be silicon oxide formed by plasma-enhanced chemical vapor deposition (PECVD). However, either or both material layer 502 and dielectric layer 506 may comprise other dielectric materials, such as organosilicate materials and fluorinated silicate materials.

As shown in FIG. 6b, a tantalum-containing layer 510 is conformally deposited along the bottom 508b and sidewalls 508s of the via 508. The tantalum-containing layer 510 serves as a barrier layer and performs several functions. It acts as an adhesion layer between the dielectric layer 506 and conductive layers subsequently deposited thereon. The tantalum-containing layer 510 also functions as a barrier against the diffusion of conductive material into layer 506, as well as the diffusion of species within dielectric layer 506 into the conductive material.

Tantalum-containing layer 510 is formed on substrate 500 according to the process conditions described above. The thickness of the tantalum-containing layer 510 is variable depending on the specific stage of processing. Typically, the tantalum-containing layer 510 has a thickness of about 50 Å to about 200 Å.

After the tantalum-containing layer 510 is formed in the via 508, the interconnect structure is completed by filling the via 508 with a conductive layer 512, as shown in FIG. 6c. The conductive layer 512 may be, for example, aluminum, copper, or tungsten, among others.

The conductive layer 512 may be deposited on the tantalum-containing layer 510 by any of various deposition means known to the art. For example, conductive layer 512 may be deposited, for example, by chemical vapor deposition, physical vapor deposition, electroless plating, or electrochemical plating. Conductive layer 512 may optionally be sequentially deposited using combinations of these methods.

2. Integrated Tantalum-containing Barrier Layer Structure

Figure 7A:
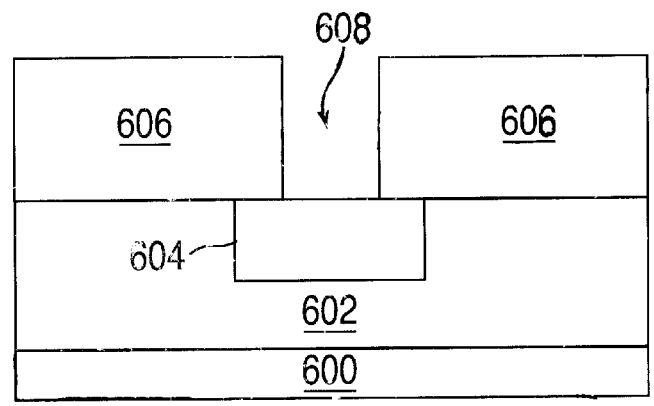
FIG. 7 depicts an interconnect structure comprising two tantalum-containing layers that may be formed using embodiments described herein.

FIGS. 7a–7d illustrate schematic cross-sectional views of a substrate 600 at different stages of an integrated circuit fabrication sequence incorporating an integrated tantalum-containing barrier layer as a barrier layer structure. In general, substrate 600 refers to any workpiece upon which film processing is performed. Depending upon the specific stage of processing, the substrate 600 may correspond to a silicon wafer, or other material layers, which have been formed on the substrate. FIG. 7a, for example, illustrates a cross-sectional view of a substrate structure in which the substrate 600 is a silicon wafer having a material layer 602 thereon.

The material layer 602 may be, for example, a dielectric layer, such as, for example, silicon oxide or other insulating material. Material layer 602 has at least one feature 604 formed therein. The feature 604 may be, for example, a metal interconnect. The feature 604 may comprise for example, copper. Alternatively, material layer 602 may be, for example, a silicon layer and the feature 604 may be a doped silicon region.

A dielectric layer 606 having an opening or via 608 therethrough is formed over the feature 604. The dielectric layer is typically an insulation material, such as, for example, an oxide. While FIG. 7a depicts a rectangular via 608, the via may have any other cross-sectional shape. Additionally, the via 608 may not extend entirely through dielectric layer 606.

The via 608 preferably has a width of about 0.25 μm or less. Furthermore, the thickness of the dielectric layer 608 is preferably at least 1.0 μm. Thus, the aspect ratio of the via, defined as the height of the via divided by its width, is typically about 4:1 or greater.

The material layer 602 and dielectric layer 606 may be silicon oxide formed by plasma-enhanced chemical vapor deposition (PECVD). However, either or both material layer 602 and dielectric layer 606 may comprise other dielectric materials, such as organosilicate materials and fluorinated silicate materials.

Figure 7B:
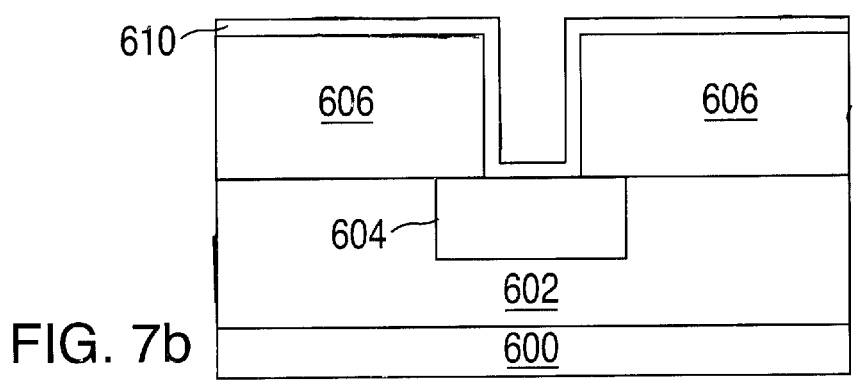

As shown in FIG. 7b, a first tantalum-containing layer 610 is conformally deposited along the bottom and sidewalls of the via 608. The first tantalum-containing layer 610 serves as a barrier layer and performs several functions. It acts as an adhesion layer between the dielectric layer 606 and layers subsequently deposited thereon. The first tantalum-containing layer 610 also functions as a barrier against the diffusion of material into layer 606, as well as the diffusion of species within dielectric layer 606 into material layers formed thereon. The first tantalum-containing layer may be for example, a tantalum nitride ($TaN_x$) layer.

The first tantalum-containing layer 610 is formed on substrate 600 according to the process conditions described above. The thickness of the first tantalum-containing layer 610 is variable depending on the specific stage of processing. Typically, the first tantalum-containing layer 610 has a thickness of about 50 Å to about 200 Å.

Figure 7C:
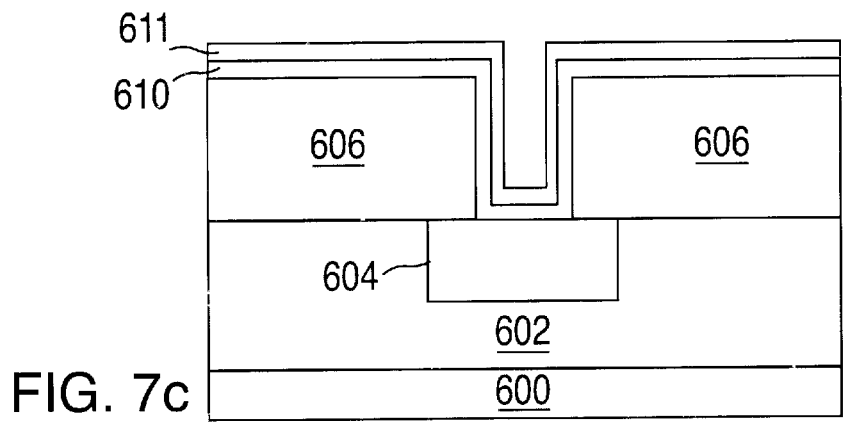

After the first tantalum containing layer 610 is formed on the substrate 600, a second tantalum-containing layer 611 is deposited thereon, as shown in FIG. 7c. The second tantalum-containing layer 611 is formed on substrate 600 according to the process conditions described above. The thickness of the second tantalum-containing layer 611 is variable depending on the specific stage of processing. Typically, the second tantalum-containing layer 611 has a thickness of about 50 Å to about 300 Å. The thickness ratio of the first tantalum-containing layer 610 to the second tantalum-containing layer 611 should preferably be about 1:1 to about 1:12.

The combination of the first tantalum-containing layer 610 and the second tantalum-containing layer 611 is advantageous in that the first tantalum layer 610 provides excellent adhesion to dielectric layer 606 and the second tantalum-containing layer 611 provides excellent adhesion to a subsequently deposited conductive material. The combination of first tantalum-containing layer 610 and the second tantalum-containing layer 611 further provides excellent barrier properties, particularly when the first tantalum-containing layer 610 comprises about 30% nitrogen and the second tantalum-containing layer 611 comprises essentially pure tantalum.

Figure 7D:
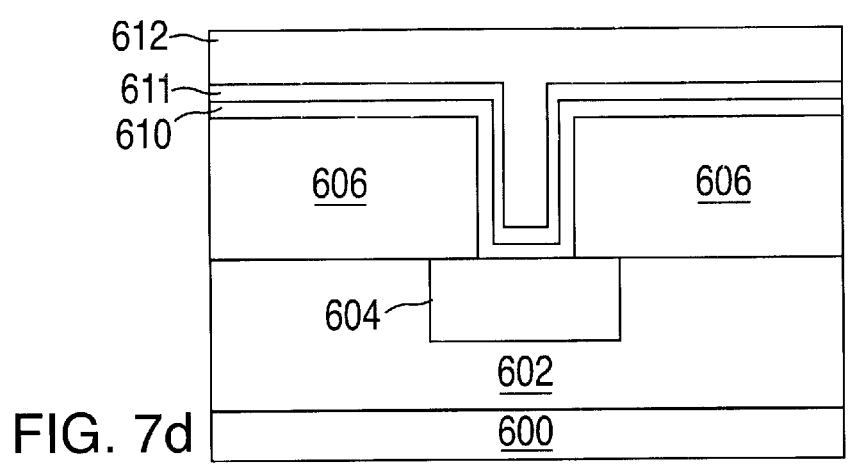

After the second tantalum-containing layer 611 is formed in the via 608, the interconnect structure is completed by filling the via 608 with a conductive layer 612, as shown in FIG. 7d. The conductive layer 612 may be, for example, aluminum, copper, or tungsten, among others.

The conductive layer 612 may be deposited on the second tantalum-containing layer 611 by any of various deposition means known to the art. For example, conductive layer 612 may be deposited, for example, by chemical vapor deposition, physical vapor deposition, electroless plating, or electrochemical plating. Conductive layer 612 may optionally be sequentially deposited using combinations of these methods.

Although various embodiments which incorporate the teachings of the present invention have been shown and described in detail herein, those skilled in the art can readily devise many other varied embodiments that still incorporate these teachings.

What is claimed is:

1. A method of forming a tantalum-containing layer on a substrate, comprising:
providing a chamber having a target comprising a tantalum-containing material and a magnetron, wherein the magnetron generates a magnetic field, and wherein the magnetron has a first magnetic pole of a first magnetic polarity surrounded by a second magnetic pole of a second magnetic polarity opposite the first magnetic polarity, the first magnetic pole having a magnetic flux at least about 30% greater than a magnetic flux of the second magnetic pole; positioning a substrate within the chamber;

providing a gas mixture to the chamber; and sputtering the tantalum-containing material from the target onto the substrate to form a tantalum-containing layer thereon by generating an electric field in conjunction with the magnetic field, wherein the magnetic field functions to confine sputtered tantalum-containing material from the target within a reaction zone of the chamber.

2. The method of claim 1 wherein the chamber is maintained at a pressure greater than about 1 millitorr.

3. The method of claim 1 wherein the electric field is generated by applying a power of at least 8 kWatts to the target.

4. The method of claim 1 wherein a bias power of up to about 1000 watts is applied to the substrate.

5. The method of claim 1 wherein the target is spaced apart from the substrate a distance greater than about 70% of the diameter of the substrate.

6. The method of claim 1 wherein the chamber further comprises one or more shields positioned along at least one chamber sidewall and adjacent to both the target and the substrate.

7. The method of claim 6 wherein a DC power is applied to at least one shield so as to form an anode grounding plane relative to the target.

8. The method of claim 6 wherein the gas mixture is provided to the chamber through one or more perforations in the one or more shields.

9. The method of claim 1 wherein the gas mixture further comprises a nitrogen-containing gas.

10. A method of forming a tantalum-containing layer on a substrate comprising:

providing a chamber having a target comprising a tantalum-containing material, a magnetron and one or more shields, wherein the one or more shields are positioned along at least one chamber sidewall and adjacent to both the target and a substrate support and at least one of the one or more shields have one or more perforations therethrough, wherein the magnetron generates a magnetic field, and wherein the magnetron has a first magnetic pole of a first magnetic polarity surrounded by a second magnetic pole of a second magnetic polarity opposite the first magnetic polarity, the first magnetic pole having a magnetic flux at least 30% greater than a magnetic flux of the second magnetic pole;

positioning a substrate within the chamber, wherein the target is spaced apart from the substrate a distance greater than about 70% of the diameter of the substrate;

providing a gas mixture to the chamber, wherein the gas mixture is provided to the chamber through the one or more perforations in the one or more shields; and sputtering the tantalum-containing material from the target onto the substrate to form a tantalum-containing layer thereon by generating an electric field in conjunction with the magnetic field, wherein the magnetic field functions to confine sputtered tantalum-containing material from the target within a reaction zone of the chamber.

11. The method of claim 10 wherein the chamber is maintained at a pressure greater than about 1 millitorr.

12. The method of claim 10 wherein the electric field is generated by applying a power of at least 8 kWatts to the target.

13. The method of claim 10 wherein a bias power of up to about 1000 watts is applied to the substrate.

14. The method of claim 10 wherein the gas mixture further comprises a nitrogen-containing gas.

15. A method of forming an interconnect structure comprising:

providing a chamber having a target comprising a tantalum-containing material and a magnetron, wherein the magnetron generates a magnetic field, and wherein the magnetron has a first magnetic pole of a first magnetic polarity surrounded by a second magnetic pole of a second magnetic polarity opposite the first magnetic polarity, the first magnetic pole having a magnetic flux at least about 30% greater than a magnetic flux of the second magnetic pole;

positioning a substrate within the chamber;

providing a gas mixture to the chamber; sputtering a tantalum-containing material from the target onto the substrate to form a first tantalum-containing layer thereon by generating an electric field in conjunction with the magnetic field, wherein the magnetic field functions to confine sputtered tantalum-containing material from the target within a reaction zone of the chamber; and depositing a conductive layer on the fast tantalum-containing layer.

16. The method of claim 15 wherein the first tantalum-containing layer comprises tantalum nitride.

17. The method of claim 16 wherein the electric field is generated by applying a power of at least 8 kWatts to the target.

18. The method of claim 16 wherein a bias power of up to about 1000 watts is applied to the substrate.

19. The method of claim 15 further comprising depositing a second tantalum-containing layer on the first tantalum-containing layer prior to depositing the conductive layer deposition.

20. The method of claim 15 wherein the chamber is maintained at a pressure greater than about 1 millitorr.

21. The method of claim 15 wherein the target is spaced apart from the substrate a distance greater than about 70% of the diameter of the substrate.

22. The method of claim 15 wherein the chamber further comprises one or more shields positioned along at least one chamber sidewall and adjacent to both the target and the substrate.

23. The method of claim 22 wherein a DC power is applied to at least one shield so as to form an anode grounding plane relative to the target.

24. The method of claim 22 wherein the gas mixture is provided to the chamber through one or more perforations in the one or more shields.

25. The method of claim 15 wherein the conductive material comprises a metal selected from the group of copper, aluminum and tungsten.

26. A method of forming an interconnect structure comprising:

providing a chamber having a target comprising a tantalum-containing material, a magnetron and one or more shields, wherein the one or more shields are positioned along at least one chamber sidewall and adjacent to both the target and a substrate support and at least one of the one or more shields have one or more perforations therethrough, wherein the magnetron generates a magnetic field, and wherein the magnetron has a first magnetic pole of a first magnetic polarity surrounded by a second magnetic pole of a second magnetic polarity opposite the first magnetic polarity, the first magnetic pole having a magnetic flux at least 30% greater than a magnetic flux of the second magnetic pole;

positioning a substrate within the chamber, wherein the target is spaced apart from the substrate a distance greater than about 70% of the diameter of the substrate;

providing a gas mixture to the chamber, wherein the gas mixture is provided to the chamber through the one or more perforations in the one or more shields;

sputtering the tantalum-containing material from the target onto the substrate to form a first tantalum-containing layer thereon by generating an electric field in conjunction with the magnetic field, wherein the magnetic field functions to confine sputtered tantalum-containing material from the target within a reaction zone of the chamber; and depositing a conductive layer on the first tantalum-containing layer.

27. The method of claim 26 wherein the first tantalum-containing layer comprises tantalum nitride.

28. The method of claim 26 further comprising depositing a second tantalum-containing layer on the first tantalum-containing layer prior to the conductive layer deposition.

29. The method of claim 26 wherein the chamber is maintained at a pressure greater than about 1 millitorr.

30. The method of claim 26 wherein the electric field is generated by applying a power of at least 8 kWatts to the target.

31. The method of claim 26 wherein a bias power of up to about 1000 watts is applied to the substrate.

32. The method of claim 26 wherein the gas mixture further comprises a nitrogen-containing gas.

33. A computer storage medium containing a software routine that, when executed, causes a general purpose computer to control a deposition chamber using a layer deposition method, comprising:

providing a chamber having a target comprising a tantalum-containing material and a magnetron, wherein the magnetron generates a magnetic field, and wherein the magnetron has a first magnetic pole of a first magnetic polarity surrounded by a second magnetic pole of a second magnetic polarity opposite the first magnetic polarity, the first magnetic pole having a magnetic flux at least about 30% greater than a magnetic flux of the second magnetic pole;

positioning a substrate within the chamber;

providing a gas mixture to the chamber; and sputtering a tantalum-containing material from the target onto the substrate to form a tantalum-containing layer thereon by generating an electric field in conjunction with the magnetic field, wherein the magnetic field functions to confine sputtered tantalum-containing material from the target within a reaction zone of the chamber.

34. The medium of claim 33 wherein the chamber is maintained at a pressure greater than about 1 millitorr.

35. The medium of claim 33 wherein the electric field is generated by applying a power of at least 8 kWatts to the target.

36. The medium of claim 33 wherein a bias power of up to about 1000 watts is applied to the substrate.

37. The medium of claim 33 wherein the target is spaced apart from the substrate a distance greater than about 70% of the diameter of the substrate.

38. The medium of claim 33 wherein the chamber further comprises one or more shields positioned along at least one chamber sidewall and adjacent to both the target and the substrate.

39. The medium of claim 38 wherein a DC power is applied to at least one shield so as to form an anode grounding plane relative to the target.

40. The medium of claim 38 wherein the gas mixture is provided to the chamber through one or more perforations in the one or more shields.

41. The medium of claim 33 wherein the gas mixture further comprises a nitrogen-containing gas.

42. A deposition chamber for sputter depositing a material layer on a substrate comprising:

a pedestal having a support surface for supporting a substrate;

a target comprising a material to be sputtered onto the substrate, wherein the target is electrically isolated from the chamber;

a first conductive shield comprising one or more perforations therethrough, wherein the first conductive shield is electrically coupled to the chamber;

a second conductive shield disposed between the one or more perforations of the first conductive shield and the target, wherein the second conductive shield is electrically coupled to the chamber; and a gas inlet positioned adjacent to the first conductive shield such that reactive gases are provided to the chamber through the one or more perforations in the first conductive shield.

43. The deposition chamber of claim 42 further comprising:

a backing plate coupled to and supporting the target; and a third conductive shield disposed between the target and the backing plate, wherein the third conductive shield limits contact between the reactive gases and the backing plate.

44. The deposition chamber of claim 43 wherein the third conductive shield is electrically isolated from the deposition chamber.

45. The deposition chamber of claim 42 wherein the first conductive shield is electrically coupled to the pedestal.

46. The deposition chamber of claim 42 wherein the target comprises a tantalum-containing material.

47. The deposition chamber of claim 42 further comprising a clamp for electrically coupling the first conductive shield and the second conductive shield to the deposition chamber.

48. The deposition chamber of claim 42 further comprising a magnetron positioned above the target, wherein the magnetron has a first magnetic pole of a first magnetic polarity surrounded by a second magnetic pole of a second magnetic polarity opposite the first magnetic polarity, the first magnetic pole having a magnetic flux at least about 30% greater than a magnetic flux of the second magnetic pole.

49. A deposition chamber for sputter depositing a material layer on a substrate comprising:

a pedestal having a support surface for supporting a substrate;

a target comprising a material to be sputtered onto the substrate, wherein the target is electrically isolated from the chamber;

a magnetron positioned above the target, wherein the magnetron has a first magnetic pole of a first magnetic polarity surrounded by a second magnetic pole of a second magnetic polarity opposite the first magnetic polarity, the first magnetic pole having a magnetic flux at least about 30% greater than a magnetic flux of the second magnetic pole;

a first conductive shield comprising one or more perforations therethrough, wherein the first conductive shield is electrically coupled to the chamber and the pedestal;

a second conductive shield disposed between the one or more perforations of the first conductive shield and the target, wherein the second conductive shield is electrically coupled to the chamber;

a third conductive shield disposed between the target and a backing plate, wherein the third conductive shield limits contact between the reactive gases and the backing plate, and a gas inlet positioned adjacent to the first conductive shield such that reactive gases are provided to the chamber through the one or more perforations in the first conductive shield.

50. The deposition chamber of claim 49 wherein the third conductive shield is electrically isolated from the deposition chamber.

51. The deposition chamber of claim 49 wherein the target comprises a tantalum-containing material.

52. The deposition chamber of claim 49 further comprising a clamp for electrically coupling the first conductive shield and the second conductive shield to the deposition chamber.

53. In a sputter system including a chamber and a target attached to and supported on a backing plate attached to said chamber, said target having a front surface composed of a material to be sputter deposited on a substrate within said chamber, said backing plate extending radially outwardly from a central axis of said chamber farther than said target, a recess being thereby formed on an outer radial side of target, the improvement comprising a shield system comprising:

a. an annular first conductive shield shaped to form a gap between said target and said backing plate and extending in back of said front surface within said recess;

b. an annular conductive second shield disposable between a side wall of said chamber and a pedestal supporting said substrate; and c. an annular conductive third shield disposable inside of said first shield to form a gap between said second and third shields.

54. The shield system of claim 53, wherein said second shield includes a plurality of perforations therethrough disposable radially outwardly of said third shield.

* * * * *